(12) United States Patent
Sekiya

(10) Patent No.: US 6,561,066 B2
(45) Date of Patent: May 13, 2003

(54) CUTTING APPARATUS EQUIPPED WITH A BLADE ALIGNING MEANS

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 57 days.

(21) Appl. No.: 09/836,240

(22) Filed: Apr. 18, 2001

(65) Prior Publication Data

US 2001/0032533 A1 Oct. 25, 2001

(30) Foreign Application Priority Data

Apr. 19, 2000 (JP) ........................................ 2000-117832

(51) Int. Cl.[7] .............................. B26D 5/20; B28D 1/04
(52) U.S. Cl. ...................... 83/76.6; 83/76.7; 125/13.01; 125/23.02
(58) Field of Search ................................. 83/76.6, 76.7, 83/74, 399, 522.15, 522.16, 522.22, 522.24; 125/13.03, 20, 23.02

(56) References Cited

U.S. PATENT DOCUMENTS 3,684,939 A * 8/1972 Perry .......................... 318/468
4,085,494 A * 4/1978 Sybertz et al. ................. 29/468
6,421,456 B1 * 7/2002 Son et al. ..................... 382/145

FOREIGN PATENT DOCUMENTS

| JP | 6-2173147 | * | 7/1987 |
| JP | 5-29410 | * | 2/1993 |
| JP | 5-326700 | * | 10/1993 |
| JP | 6-270038 | * | 9/1994 |

* cited by examiner

Primary Examiner—M. Rachuba
(74) Attorney, Agent, or Firm—Wenderoth, Lind & Ponack, L.L.P.

(57) ABSTRACT

Disclosed is a cutting apparatus equipped with a device for alignment of its rotary blade relative to a selected street on a semiconductor wafer. The cutting apparatus has a marking member positioned at such a place that the rotary blade can make an alignment mark, spaced from the wafer in an indexing direction, on the marking member, thereby permitting the rotary blade to be put in precise alignment relative to a selected cutting line on the semiconductor wafer by adjusting the rotary blade in the direction traversing the street-cutting direction until the trace of the rotary blade has been put in alignment with a reference hairline

5 Claims, 8 Drawing Sheets

CUTTING APPARATUS EQUIPPED WITH A BLADE ALIGNING MEANS

BACKGROUND OF THE INVENTION

1. Field of the Invention

The present invention relates to a cutting apparatus for cutting a workpiece such as a semiconductor wafer with precision.

2. Related Art

FIG. 7 shows a semiconductor wafer cutting apparatus. It comprises a holder means 15 for holding a workpiece to be cut, a cutting means 23 including a rotary blade 24 for cutting the workpiece held by the holder means 15, an alignment means 36 having an imaging means 37 equipped therewith, and other associated parts. As seen from the drawing, a semiconductor wafer W is attached to a holder frame F using a piece of adhesive sheet T, and the wafer-bearing holder frame F is held on the holder means 15. The holder means 15 is driven in the X-axial direction to be just below the alignment means 36, allowing the alignment means 36 to detect a selected street along which the semiconductor wafer W is to be cut, and then, the holder means 15 is further driven in the X-axial direction while the cutting means 23 is lowered, thus allowing the rotary blade 24 to cut the semiconductor wafer W along the selected street.

The alignment means 36 and the cutting means 23 are integrally connected to each other, so that these parts may be moved as a whole in the Y- and Z-axial directions. The alignment means 36 is equipped with the imaging means 37, e.g., comprising a CCD camera. As shown in FIG. 8, the imaging means 37 has an imaging screen 38 in which a hairline 39 is drawn as a reference line in the X-axial direction.

Before cutting the semiconductor wafer along a selected street, it is necessary that the rotary blade 24 be set in alignment with the hairline 39 in the X-axial direction, as shown in FIG. 9. The imaging means 37 is moved in the Y-axial direction to scan an image of the selected street along which the semiconductor wafer W is to be cut, and a required adjustment is made until the selected street is found in alignment with the hairline 39, which means that the rotary blade 24 is put in alignment with the selected street.

After establishing the alignment of the rotary blade 24 with the selected street to be cut, the holder means 15 is driven in the X-axial direction while the cutting means 23 is lowered in the Z-axial direction, thus allowing the rotary blade 24 to cut the semiconductor wafer W along the selected street.

Every time the cutting means 23 is moved by a street-to-street interval in the Y-axial direction, the cutting operation is resumed. Finally the semiconductor wafer W is cut along all streets in the X-axial direction. Then, the wafer-holding table 15 is rotated 90 degrees to repeat the cutting operation of the semiconductor wafer. Thus, the semiconductor wafer W is cut crosswise into squares.

Required precise cutting can be attained provided that the rotary blade 24 is aligned exactly with the hairline 39 in terms of their Y-coordinate. Such alignment, however, cannot be attained, for instance, if a new rotary blade is used in place of the old one; rotary blades cannot be exactly the same, but they are somewhat different from each other to the extent of causing misalignment between the new rotary blade and the hairline in terms of their Y-coordinate.

As seen from FIGS. 10(A) and 10(B), the rotary blade 24 is press-fitted on a rotary spindle 50, and then a screw nut 51 is applied to a threaded-end 52 of the rotary spindle 50 to tighten the rotary blade 24 with the screw nut 51, sandwiching the rotary blade 24 between a mount flange 53 and the screw nut 51. The position of the rotary blade 24 on the spindle 50 will minutely vary according to a degree of fastening or tightening with the screw nut 51 and the like, and it is very difficult to fasten a new rotary blade 24 as tightly as in another or old one, in case of, e.g., changing the rotary blade. Therefore, the new rotary blade 24 would usually be spaced apart more or less from the hairline 39.

Conventionally, in replacing the rotary blade with a new one, a dummy wafer is held by the holder means 15, and then the new rotary blade is used to cut a straight groove 54 on the dummy wafer. The imaging means 37 is used to scan an image of the straight groove 54. If the image of the straight groove 54 is not found in alignment with the hairline 39 (see FIG. 11), an adjusting screw is rotated until the image of the straight groove 54 has been put in alignment with the hairline 39 (see FIG. 12). This is tedious, time-consuming work.

Assuming that the rotary blade 24 happens to be broken while cutting a semiconductor wafer, the broken rotary blade 24 must be removed from the rotary spindle 50 to be replaced with a new one, following a series of actions beginning with the changing of the broken rotary blade for a dummy wafer and ending with the aligning of the straight groove made on the dummy wafer with the hairline.

Subsequent to the alignment effected on the dummy wafer relative to the hairline 39, the dummy wafer must be removed from the holder means 15 to put the unfinished semiconductor wafer in place of the dummy wafer, and again an image of the unfinished cut along the selected street is scanned for alignment with the new rotary blade before resuming the cutting of the semiconductor wafer. This is a significant cause of lowering the workability and productivity.

SUMMARY OF THE INVENTION

One object of the present invention is to enable the changing of rotary blades in a cutting machine without requiring such tedious, time-consuming work as described above.

To attain this object, the present invention provides a cutting apparatus comprising at least a holder means for holding a workpiece to be cut and a cutting means including a rotary blade for cutting the workpiece held by the holder means, where the holder means and the cutting means are adapted to be driven relative to each other in a cutting direction, an indexing direction and a blade-thrusting direction, which apparatus further comprises a marking member positioned at such a place that the rotary blade can make a mark of cutting position (alignment marks) in an indexing direction on the marking member in order to align the rotary blade with a cutting line on the workpiece.

The marking member may be of an abrasion-resistant material.

The abrasion-resistant material may be a hard urethane.

The cutting apparatus may further comprise an alignment means having an imaging means for scanning a cutting area of the workpiece held on the holder means in order to align the cutting area and the rotary blade with each other with respect to the indexing direction, the imaging means having an imaging screen with a hairline drawn as a reference line for the alignment on the screen, wherein the mark of cutting position made on the marking member is scanned by the imaging means and imaged on the screen, while the mark of cutting position is aligned with the hairline on the screen, whereby the alignment of the cutting area with the blade is attained.

Thanks to the marking member the quick and easy alignment of the rotary blade relative to the hairline is permitted without using a dummy wafer. If the marking member is made of an abrasion-resistant material, marks made on the marking member become invisible in a while, thus permitting the marking member to be used repeatedly.

Further, even when a rotary blade is broken during the cutting operation, the broken blade can be readily changed without putting an operator to such a bother as in the conventional cutting machine.

Other objects and advantages of the present invention will be understood from the following description of a cutting apparatus according to one preferred embodiment of the present invention, which is shown in accompanying drawings.

DETAILED DESCRIPTION OF PREFERRED EMBODIMENT

Figure 1:
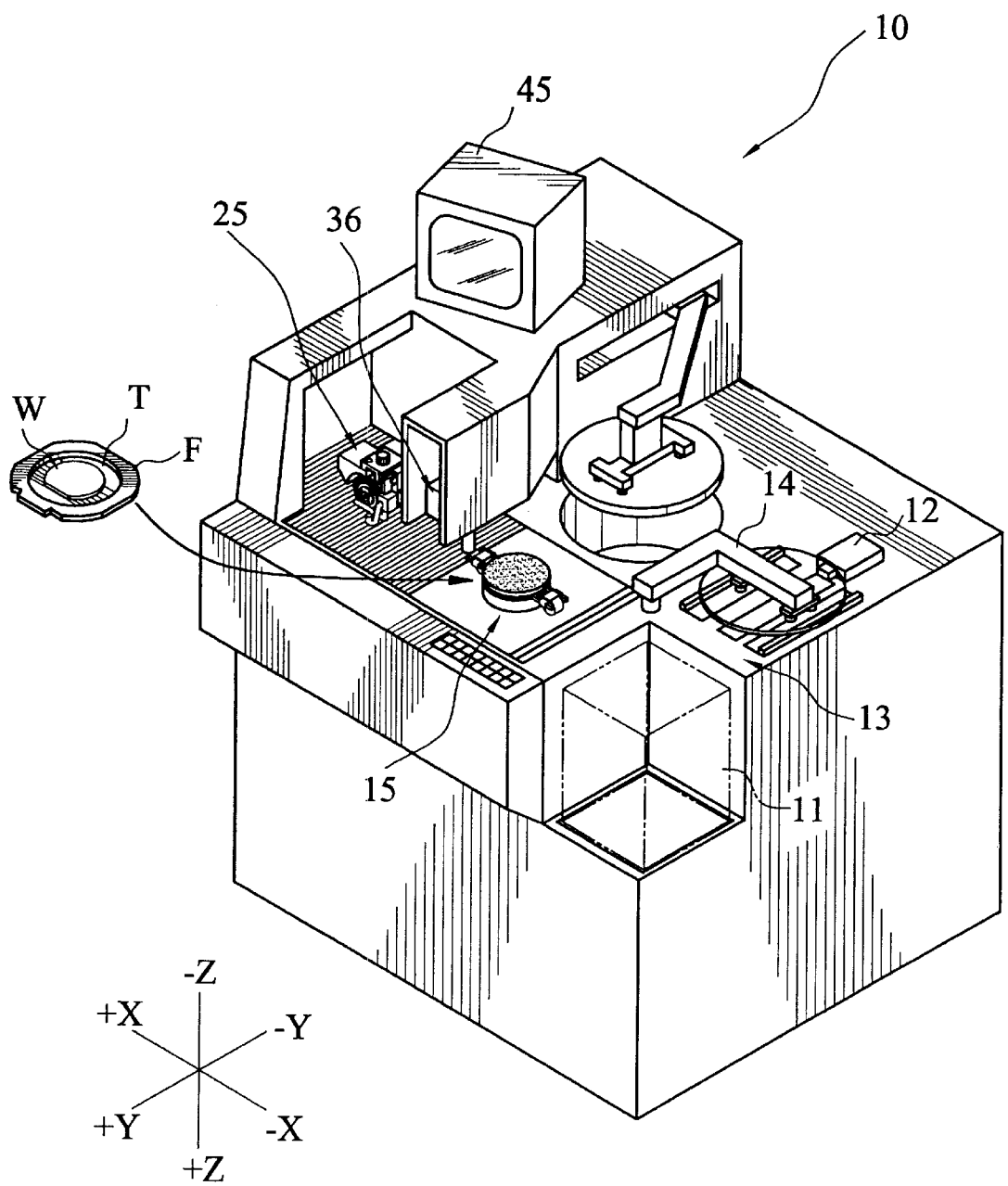
FIG. 1 is a perspective view of a cutting apparatus according to one preferred embodiment of the present invention.

Referring to FIG. 1, a semiconductor wafer W is attached to a frame F with a piece of adhesive sheet T in order to be cut with use of a cutting apparatus 10. Pluralities of wafer-bearing frames F are put in a cassette 11.

A taking-in-and-out means 12 takes a selected wafer-bearing frame from the cassette 11 to bring the same to a tentative storage area 13, and a transport means 14 thereafter transports the wafer-bearing frame to the holder means 15.

Figure 2:
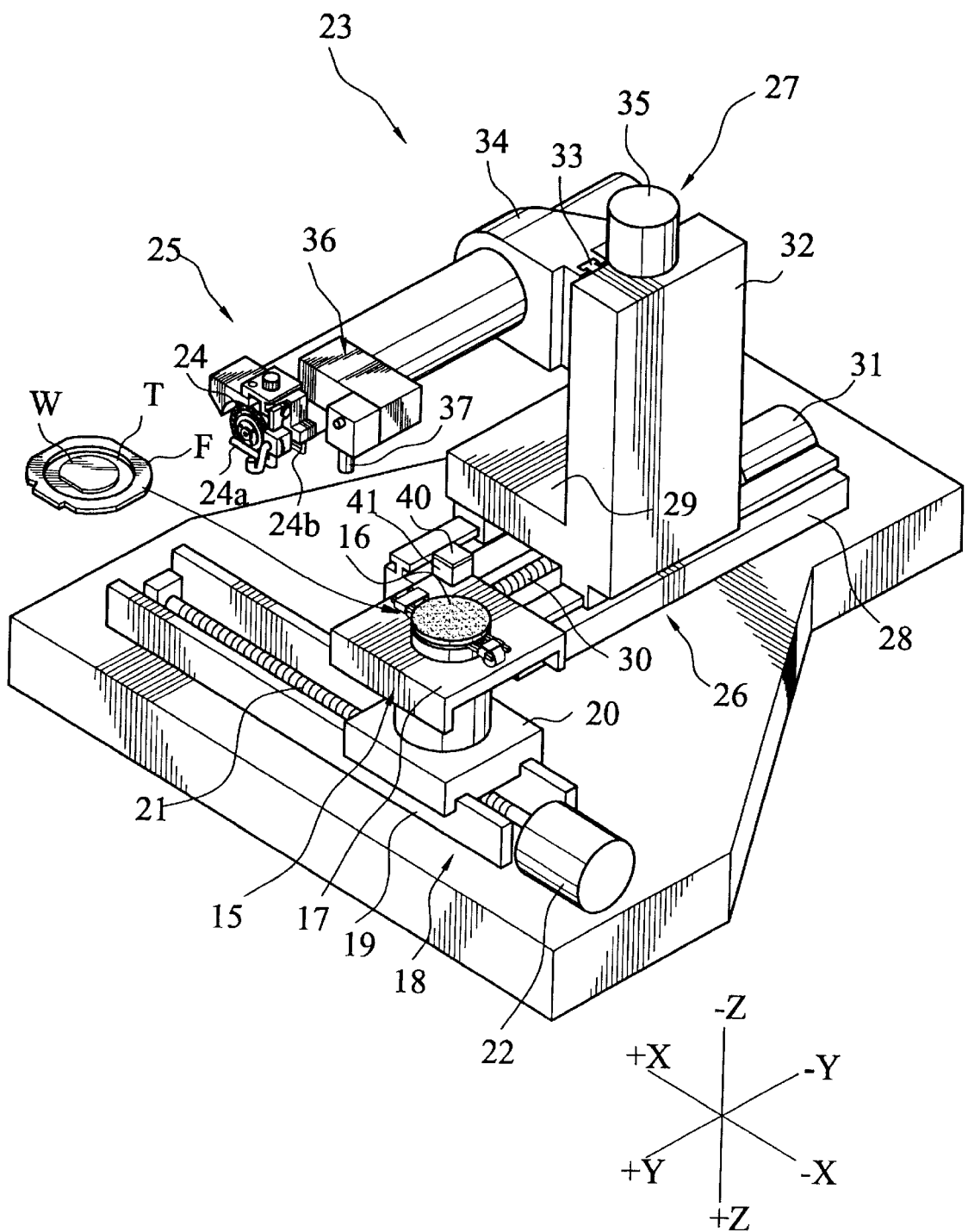
FIG. 2 is a perspective view showing a detailed partial interior structure of the cutting apparatus.

Referring to FIG. 2, the holder means 15 comprises a chuck table 16 for holding a semiconductor wafer W and an X-axial transfer table 17, which bears the chuck table 16 rotatably. The X-axial transfer table 17 is movably supported by an X-axial slider 18.

The X-axial slider 18 comprises an X-axial guide rail 19 extending in the X-axial direction along which a semiconductor wafer W is to be cut, an X-axial transfer stage 20 slidably supported by the X-axial guide rail 19, an X-axial screw rod 21 which is threadedly engaged with a screw nut (not shown) provided on the X-axial transfer stage 20, and an X-axial drive 22 for rotating the X-axial screw rod 21. The holder means 15 is fixed to the X-axial transfer stage 20.

A cutting means 23 is used for cutting a semiconductor wafer W held on the holder means 15. It comprises a rotary blade 24, water nozzles 24a and 24b positioned on the opposite sides of the rotary blade 24, a rotary spindle unit 25 for supporting the rotary blade 24, a Y-axial slider 26 for supporting the rotary spindle unit 25 so that the rotary spindle unit 25 is movable in the Y-axial direction for indexing, and a Z-axial slider 27 for supporting the rotary spindle unit 25 so that the rotary blade 24 is movable in the Z-axial direction for allowing the rotary blade 24 to thrust into the thickness of the semiconductor wafer W.

The Y-axial slider 26 comprises a Y-axial guide rail 28 extending in the Y-axial direction, a Y-axial transfer stage 29 slidably supported on the Y-axial guide rail 28, a Y-axial screw rod 30 which is threadedly engaged with a screw nut (not shown) provided on the Y-axial transfer stage 29, and a Y-axial drive 31 for rotating the Y-axial screw rod 30. The Y-axial transfer stage 29 has an upright wall 32 on one side.

The Z-axial slider 27 comprises a Z-axial guide rail 33 laid on the upright wall 32 of the Y-axial transfer stage 29 and extending in the Z-axial direction, an ascending-and-descending part 34 carrying the rotary spindle unit 25 and slidably supported on the Z-axial guide rail 33, a Z-axial screw rod (not shown) which is threadedly engaged with a screw nut (not shown) provided on the ascending-and-descending part 34, and a Z-axial drive 35 for rotatably driving the Z-axial screw rod.

Figure 8:
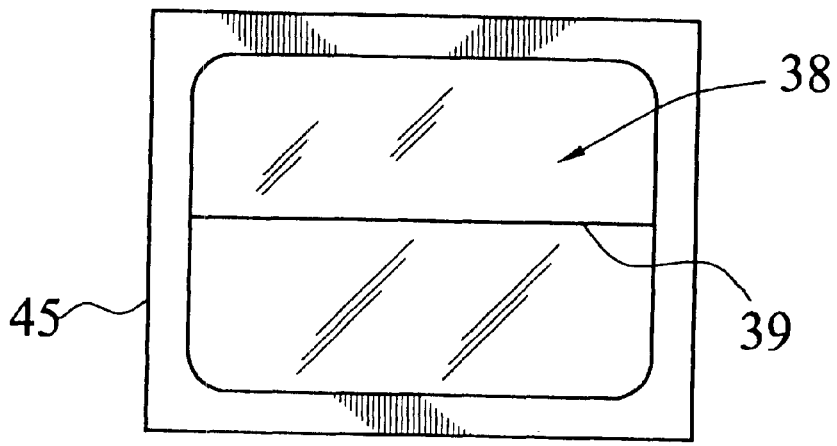
FIG. 8 shows a hairline appearing in the screen of a monitor.
Figure 9:
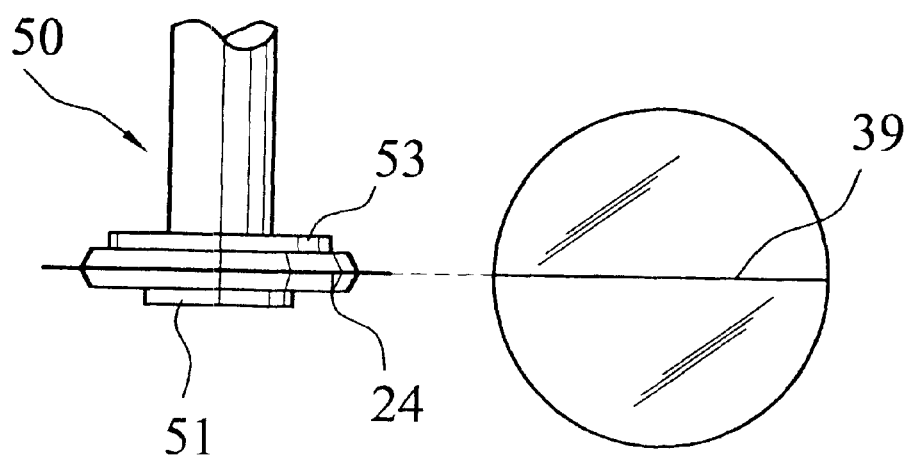
FIG. 9 illustrates how the rotary blade must be positioned relative to the hairline.

The spindle unit 25 has one side to which an alignment means 36 is fixed. The alignment means 36 includes an imaging means 37, e.g., comprising a CCD camera. The imaging means 37 has an imaging screen 38 in which a hairline 39 is drawn, as seen from FIG. 8. The hairline 39 can be used as a reference line. The reference line 39 extends in the X-axial direction, and it appears on the screen of a monitor 45, which is positioned on the top of the cutting apparatus 10 as shown in FIG. 1.

The X-axial transfer table 17 has one corner to which a marking member 40 is fixed. The marking member 40 is so positioned that the rotary blade 24 may touch the marking member 40 to give a trace of the rotary blade to its upper surface when moving the rotary blade 24 on the marking member in the X-axial direction. The marking member 40 is of an abrasion-resistant material such as a hard urethane, and is supported on an associated marking stage 41.

Now, the manner in which the cutting apparatus 10 is used in dicing a semiconductor wafer W on the holder means 15 is described below.

Figure 10A:
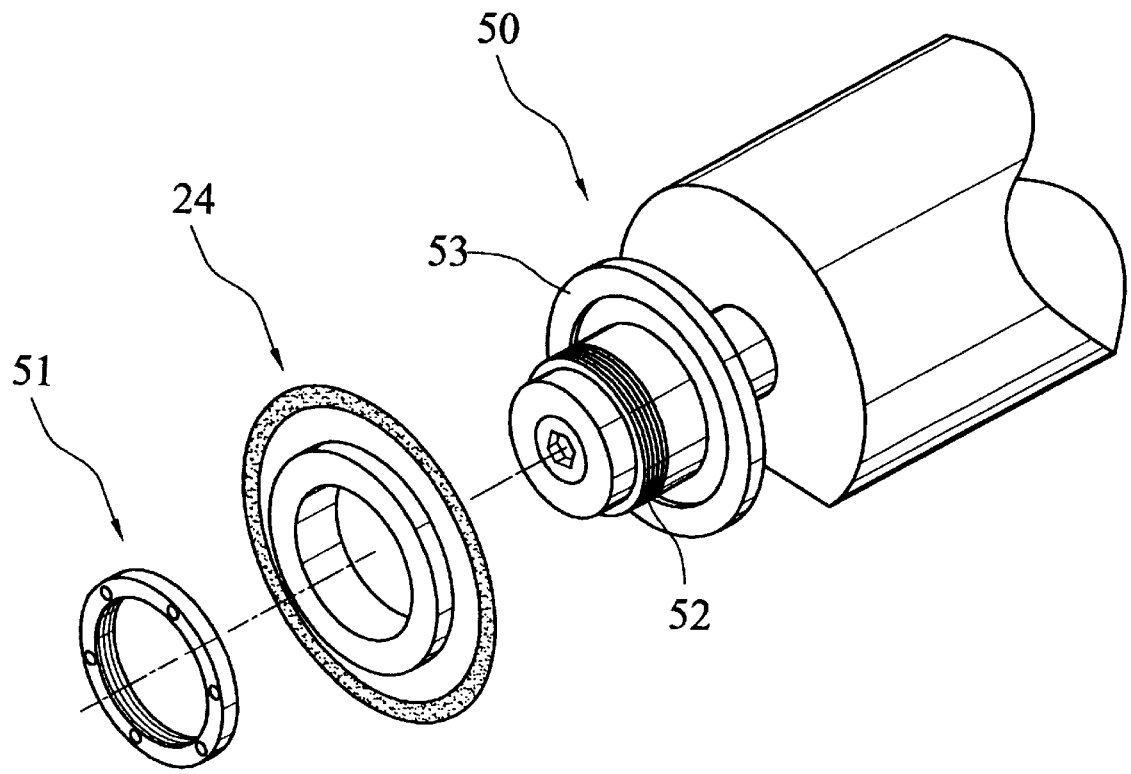
FIG. 10(A) is an exploded view.
Figure 10B:
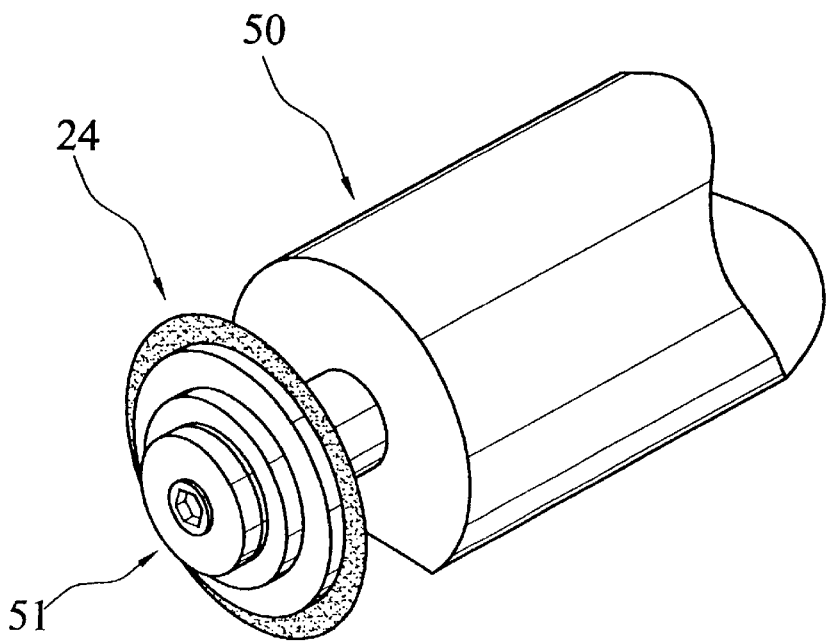
FIG. 10(B) is a perspective view of the blade-and-spindle assembly, together illustrating how the rotary bade is attached to the rotary spindle.
Figure 11:
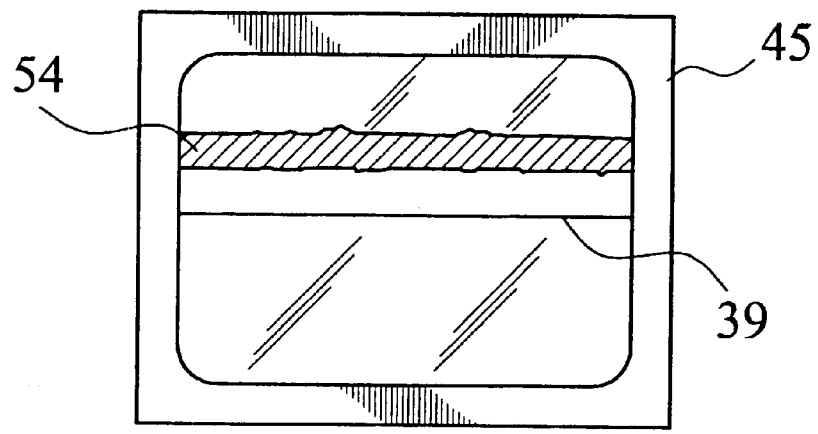
FIG. 11 shows an imaging screen where an image of a cut groove is out of alignment with the hairline.
Figure 12:
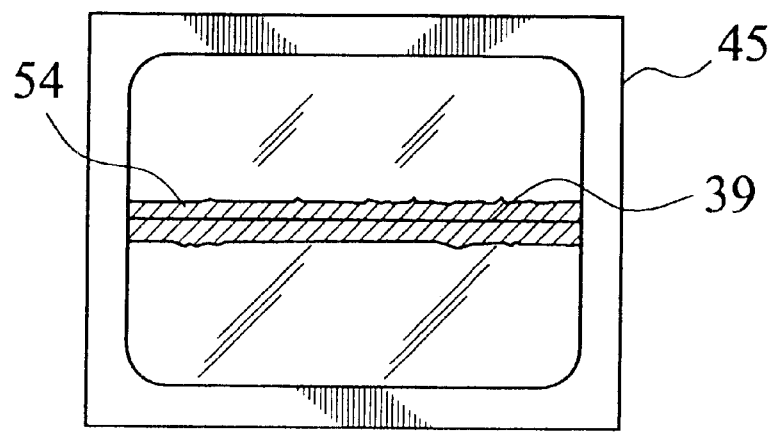
FIG. 12 shows the imaging screen where the image of the cut groove is in alignment with the hairline.

At first, a rotary blade 24 is fixed to the rotary spindle 50 as seen from FIGS. 10(A) and 10(B). Specifically the rotary blade 24 must be fixed to the rotary spindle 50 so that the Y-coordinate of the rotary blade 24 is in agreement with the Y-coordinate of the hairline 39, i.e. that the rotary blade 24 is aligned with the hairline 39 in the X-axial direction, as described later in detail.

Figure 3:
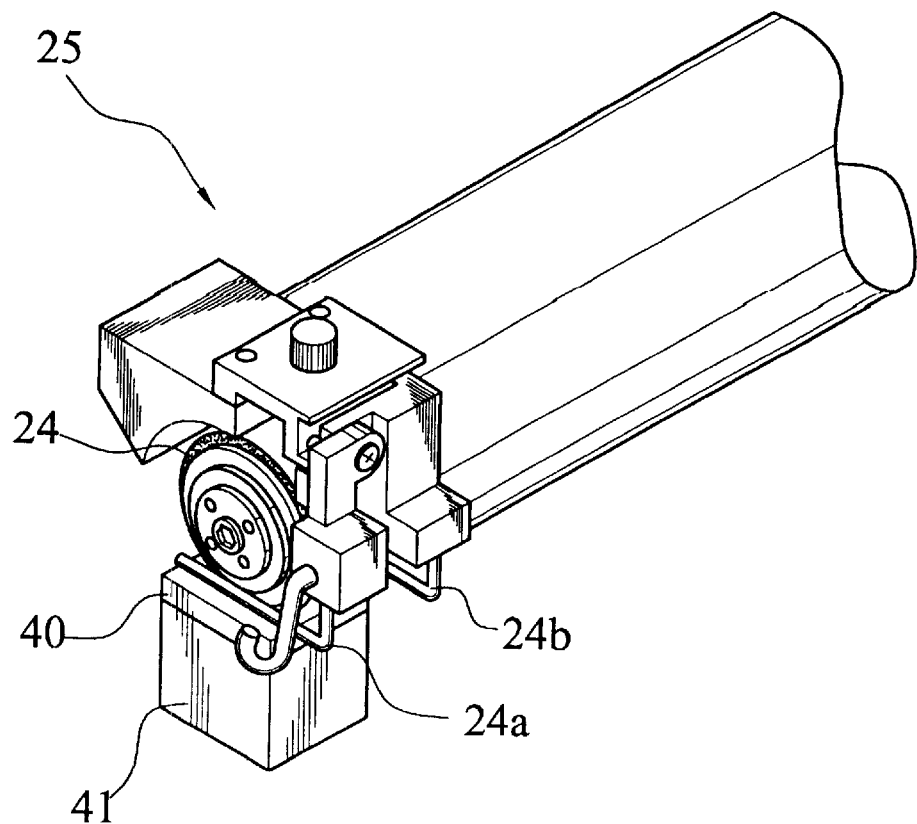
FIG. 3 is a perspective view for illustrating how a mark of cutting position (alignment mark) is made on a marking member in the cutting apparatus.
Figure 4:
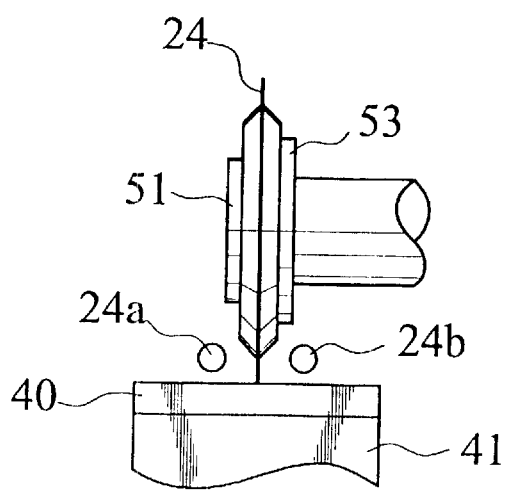
FIG. 4 is a side view for illustrating how the mark of cutting position is made on the marking member.

After fixing the rotary blade 24 to the rotary spindle 50, the holder means 15 is moved in the X-axial direction, and the rotary spindle unit 25 is moved in the Y-axial direction so that the rotary blade 24 is brought above the marking member 40. Then, the rotary blade 24 is rotated at an increased speed while it is lowered in the +Z-axial direction until the rotary blade 24 has been put in contact with the upper surface of the marking member 40, as shown in FIGS. 3 and 4. Thus, a trace 42 of the rotary blade 24 is left as a mark of cutting position (alignment mark) on the upper surface of the marking member 40.

Figure 5:
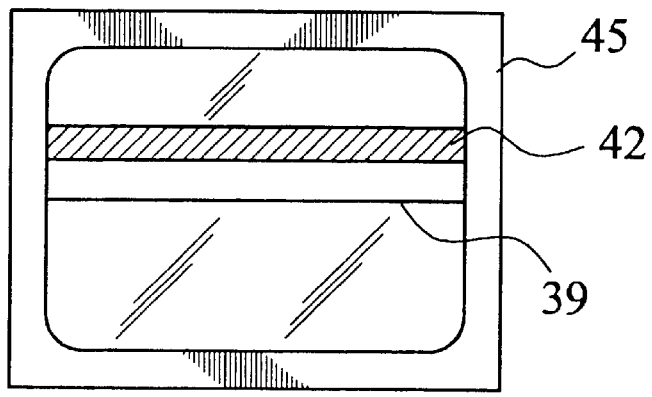
FIG. 5 illustrates an imaging screen where the mark of cutting position is out of alignment with a hairline.
Figure 6:
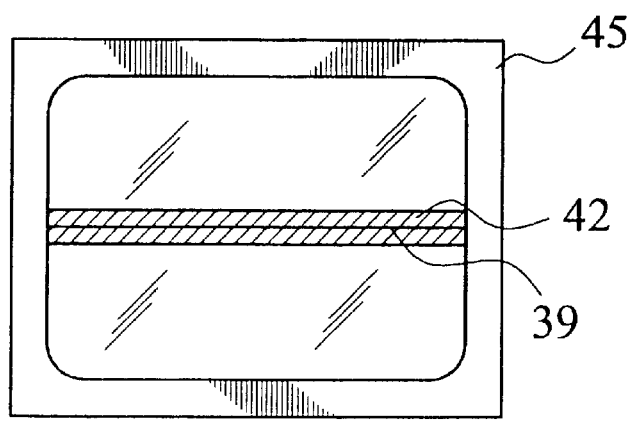
FIG. 6 illustrates the imaging screen where the mark of cutting position is in alignment with the hairline.
Figure 7:
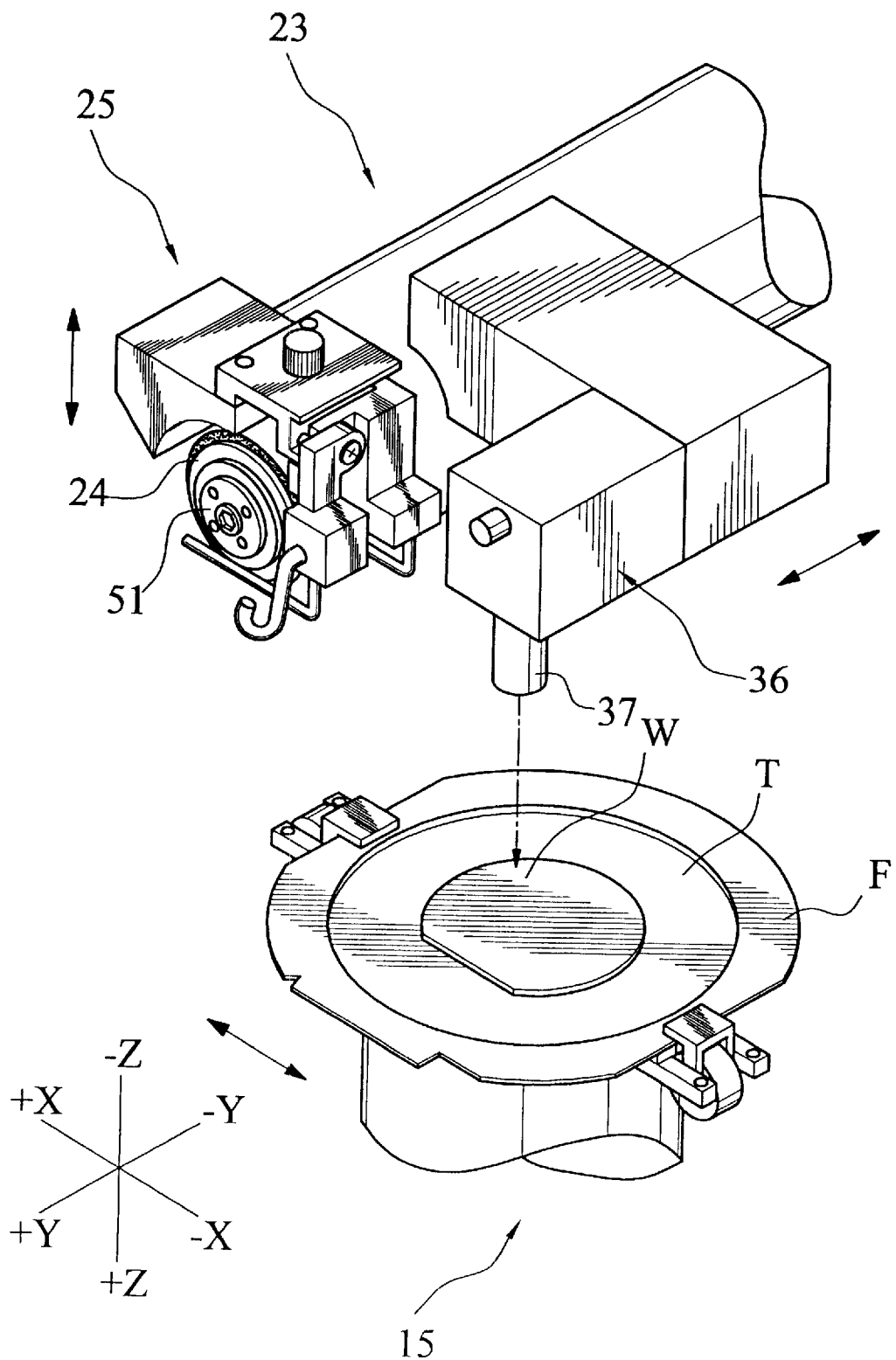
FIG. 7 illustrates how a cutting means cuts a semiconductor wafer held on a holder means.

Then, the holder means 15 is moved in the −X-axial direction to put the marking member 40 just below the imaging means 37 without changing the rotary blade 24 in the Y-axial direction, and an image of the trace of the rotary blade 24 is taken. If the image of the blade trace 42 is not found to be aligned with the hairline 39 on the monitor screen 45 as shown in FIG. 5, the operator moves the alignment means 36 in the Y-axial direction with use of an adjusting screw until the blade trace 42 is put in alignment with the hairline 39 on the monitor screen 45 as shown in FIG. 6.

The Y-axial alignment of the rotary blade 24 effected with the aid of the marking member makes it unnecessary to use a dummy wafer, which has the effect of saving costs and time in pre-setting the cutting apparatus.

After confirming that the blade trace 42 is in alignment with the hairline 39 on the monitor screen 45 (see FIG. 6), a semiconductor wafer W is put and fixedly held on the holder means 15 in correct position, as shown in FIGS. 1 and 2, in which the exact and precise street-and-blade alignment is established. Then, an image of the semiconductor wafer W is scanned with use of the imaging means 37 so that a street to be cut first is detected by effecting a required pattern-matching with respect to the street image stored in the alignment means 36.

In effecting the required pattern-matching, the alignment means 36 is moved in the Y-axial direction by the Y-axial slider 26 while the imaging means 37 continues to scan images of streets on the semiconductor wafer W until the street of which an image is scanned is found to be consistent with one selected among the street images already stored, and then, it is determined that the street to be cut first is detected, stopping the alignment means 36.

The alignment means 36 and the rotary spindle unit 25 are integrally combined. This integral arrangement allows in operation that: the movement of the rotary spindle unit 25 in the Y-axial direction is made to stop, provided that the alignment with the hairline is established, and that the street to be cut first is detected, and then the movement of the holder means 15 in the +X-axial direction and the high-speed rotation and Z-axial descend of the rotary blade 24 starts, permitting the rotary blade 24 to cut the so-detected street.

Subsequent to the cutting along the detected street of the semiconductor wafer W, the rotary spindle unit 25 is moved by the street-to-street interval in the Y-axial direction, and then the holder means 15 is moved in the X-axial direction while the spindle unit 25 is lowered in the Z-axial direction so that the rotary blade 24 may cut the adjacent street on the semiconductor wafer W. The holder means 15 and the cutting means 23 are moved relative to each other in the cutting, indexing and blade-thrusting directions to allow the rotary blade 24 to cut the semiconductor wafer W along streets one after another.

After completing the cutting along each and every street of the semiconductor wafer W in one direction, the chuck table 16 is turned 90 degrees to repeat the street cutting in the direction traversing the one direction, thus cutting the semiconductor wafer into squares.

The rotary blade must be changed upon expiration of its life or breakage. Rotary blades of the same specifications, however, are different more or less in physical characteristics or they cannot be mounted exactly and precisely in the same condition in the rotary spindle. As a result the new rotary blade when attached to the rotary spindle is inconsistent with the hairline in their Y-coordinates. To reduce such misalignment, the new rotary blade is used to make a trace of blade as a mark of cutting position (alignment mark) on the marking member 40, and adjustment is made to put the mark of cutting position in alignment with the hairline 39, thereby putting the rotary blade 24 in exact and precise alignment with the streets in one direction on the semiconductor wafer W, which is held in correct position on the holder means.

The marking member, if made of an abrasion-resistant material, will allow the trace of blade to disappear after a while, and therefore, such marking member need not be changed for an extended period. The marking member, however, is detachably fixed to the marking stage so that it can be replaced after an extended length of time.

In removing the rotary blade from the rotary spindle 50 and attaching a new one in the conventional cutting apparatus it is necessary to: remove the unfinished semiconductor wafer from the holder means 15 to put a dummy wafer in place of the unfinished semiconductor wafer; cut a straight groove on the dummy wafer with the new rotary blade; put the straight groove in alignment with the hairline 39; remove the dummy wafer from the holder means 15 to put the unfinished semiconductor wafer in place of the dummy wafer; scan an image of the street to be cut first for alignment; and resume the cutting operation. This tedious, consuming work is unnecessary in the present invention, and accordingly the workability and productivity is improved.

What is claimed is:

1. A cutting apparatus comprising:
   a holder device including an X-axial transfer table, and a chuck table rotatably mounted on said X-axial transfer table for holding a workpiece at a workpiece cutting position of said X-axial transfer table;
   a cutting device including a rotary blade for cutting the workpiece when the workpiece is held by said chuck table at said workpiece cutting position; and
   a marking member fixed to said X-axial transfer table;
   wherein said X-axial transfer table and said cutting device are arranged to be movable relative to each other such that said X-axial transfer table can be driven to move in an X-axial direction relative to said cutting device, such that said cutting device can be driven to move in a Y-axial direction, perpendicular to said X-axial direction, relative to said X-axial transfer table and such that said cutting device can be driven to move in a Z-axial direction, perpendicular to said X-axial direction and said Y-axial direction, relative to said X-axial transfer table;
   wherein said marking member is fixed to said X-axial transfer table in such a position that said rotary blade of said cutting device can make an alignment mark on said marking member in a location spaced apart in said Y-axial direction from the workpiece when the workpiece is held by said chuck table at said workpiece cutting position, so that said rotary blade of said cutting device can make the alignment mark on said marking member while the workpiece is held by said chuck table at said workpiece cutting position.

2. A cutting apparatus according to claim 1, wherein said marking member is formed of an abrasion-resistant material.

3. A cutting apparatus according to claim 2, wherein said abrasion-resistant material comprises a hard urethane.

4. A cutting apparatus according to claim 1, wherein said marking member is detachably fixed to said X-axial transfer table.

5. A cutting apparatus according to claim 1, further comprising:

an alignment mechanism having an imaging device for scanning a cutting area of the workpiece held on said chuck table at said workpiece cutting position, in order to align the cutting area and said rotary blade with each other with respect to said Y-axial direction, said imaging device including an imaging screen with a hairline drawn as a reference line, wherein the alignment mark made on said marking member is scanned by said imaging device and imaged on said imaging screen, and the alignment is aligned with said hairline on said imaging screen.

* * * * *